(12) United States Patent
Etawil et al.

(10) Patent No.: US 7,168,053 B1
(45) Date of Patent: Jan. 23, 2007

(54) METHOD AND SYSTEM FOR IMPLEMENTING AN ANALYTICAL WIRELENGTH FORMULATION

(75) Inventors: Hussein Etawil, Santa Clara, CA (US); Krishna Belkhale, Saratoga, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 196 days.

(21) Appl. No.: 11/026,511

(22) Filed: Dec. 29, 2004

(51) Int. Cl.
*G06F 17/50* (2006.01)

(52) U.S. Cl. ............... 716/2; 716/9; 716/12; 716/13
(58) Field of Classification Search ............... 716/2, 716/9, 11, 12, 13
See application file for complete search history.

(56) References Cited

U.S. PATENT DOCUMENTS

| | | | |
|---|---|---|---|
| 4,615,011 A | 9/1986 | Linsker | |
| 4,782,193 A | 11/1988 | Linsker | |
| 5,784,289 A | 7/1998 | Wang | |
| 6,155,725 A | 12/2000 | Scepanovic et al. | |
| 6,493,658 B1 | 12/2002 | Koford et al. | |
| 6,671,864 B2 | 12/2003 | Teig et al. | |
| 7,058,913 B1 * | 6/2006 | Siegel et al. | 716/10 |
| 2001/0018759 A1 | 8/2001 | Andreev et al. | |
| 2003/0101428 A1 | 5/2003 | Teig et al. | |
| 2004/0098697 A1 | 5/2004 | Frankle et al. | |

OTHER PUBLICATIONS

Hu, Jiang and Sapatnekar, Sachin S., "*A Timing-Constrained Simultaneous Global Routing Algorithm*", IEEE Transactions on Computer-Aided Design of Integrated Circuits and Systems, Sep. 2002, pp. 1025-1036, vol. 21, No. 9, IEEE, USA.

Teig, Steven L., "*The X Architecture: Not Your Father's Diagonal Wiring*", Proceedings of SLIP 2002, Apr. 6-7, 2002, San Diego, CA, pp. 33-37, 2002, ACM, USA.

Yang, Xiaojian; Wang, Maogang; Kastner, Ryan; Ghiasi, Soheil; Sarrafzadeh, Majid, "*Congestion Reduction During Placement With Provably Good Approximation Bound*", ACM Transactions on Design Automation of Electronic Systems, Feb. 2003, pp. 1 17; vol. V, No. N, USA.

* cited by examiner

*Primary Examiner*—Thuan Do
(74) *Attorney, Agent, or Firm*—Bingham McCutchen LLP

(57) ABSTRACT

Disclosed are methods and systems for specifying an analytical wirelength formulation that is continuous along with its derivative. One approach performs a wirelength estimate in which a continuous formulation is employed to identify and use a bounding box to enclose circuit elements of a net, and in which an attribute of the bounding box may be completely or partially diagonal. Such formulations are used for optimizing the wirelength using numerical approaches.

20 Claims, 17 Drawing Sheets

Fig. 1 - Diagonal Wiring

Fig. 2 - Layers with Different Routing Directions

Fig. 3 - Manhattan Bounding Box

Architecture with diagonal wiring:
Est. Wirelength = ½ (x_a + x_b + y_a + y_b + D1_a + D1_b + D2_a + D2_b)

Fig. 4 - Octagonal Bounding Box

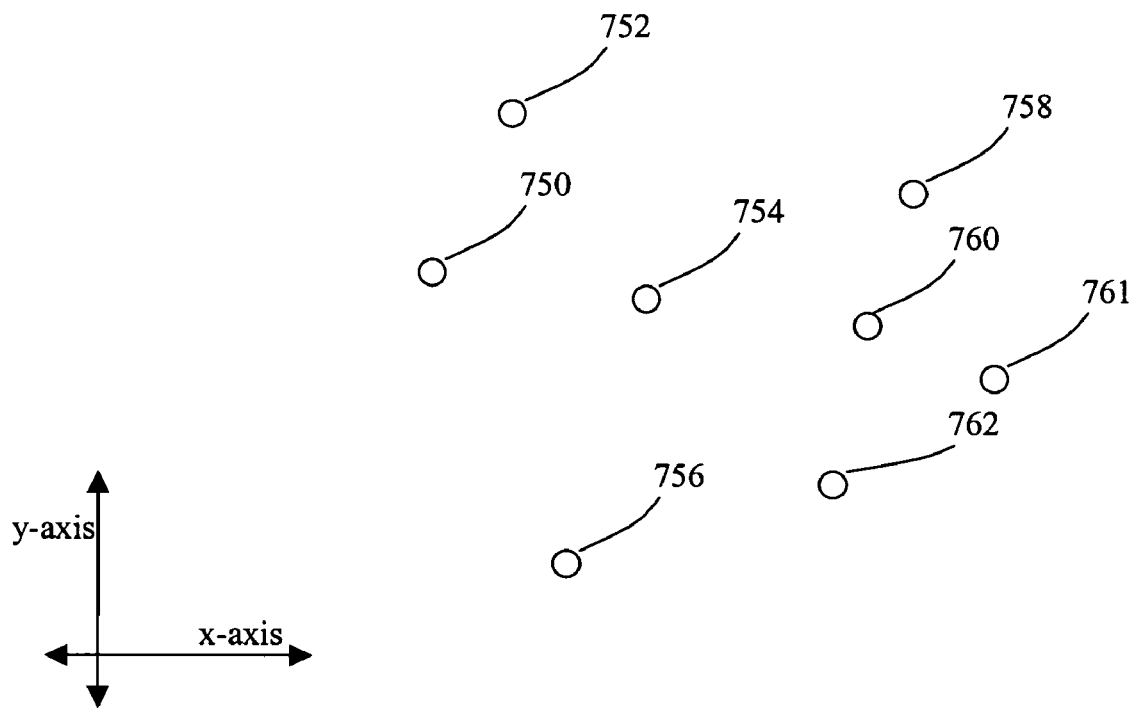
Fig. 7A - Set of Pins to Connect

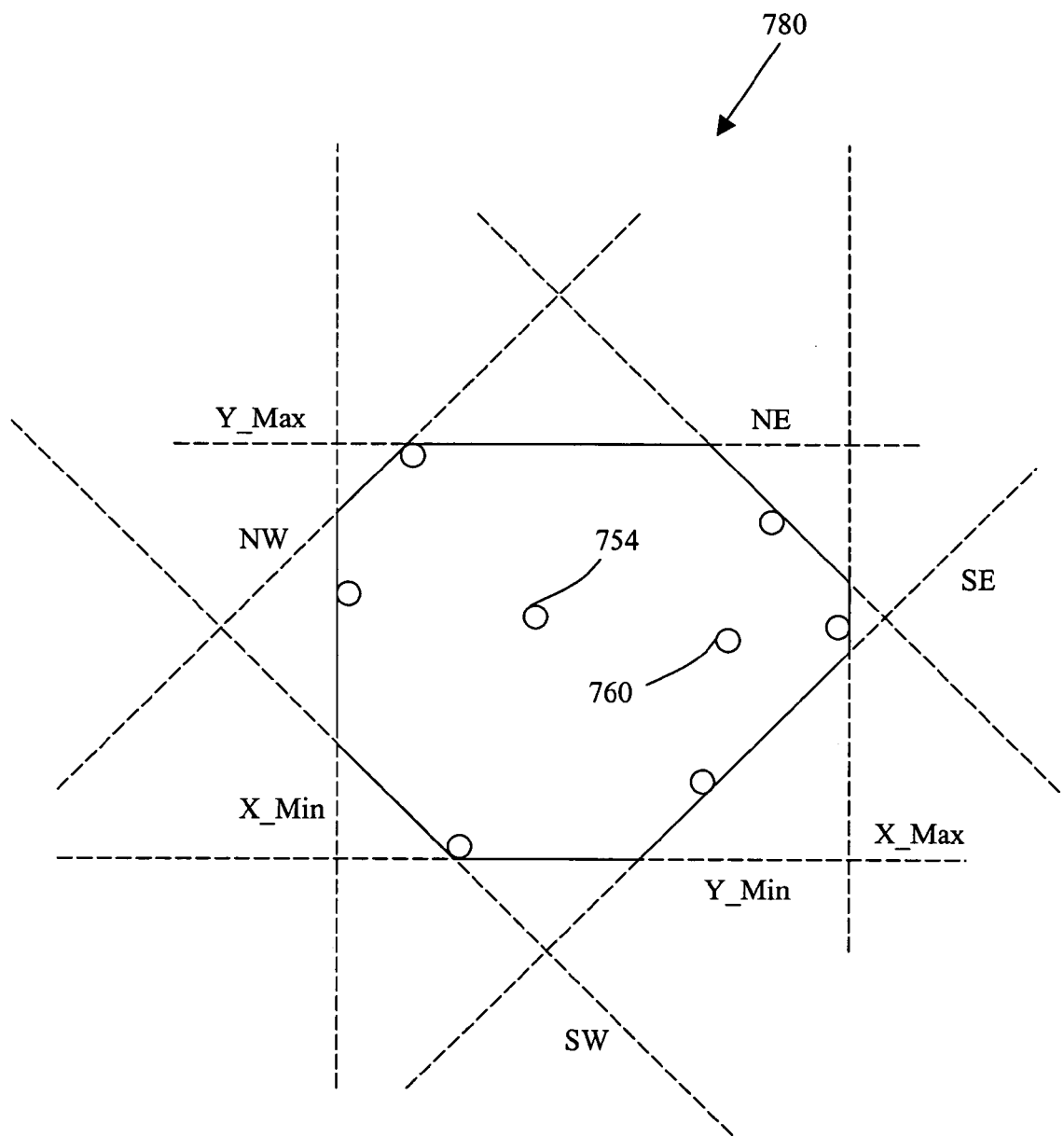
Fig. 7J - Outline Bounding Box

Est. Wirelength = ½ ($L_{Y\_max} + L_{Y\_min} + L_{X\_max} + L_{X\_min} + L_{NW} + L_{NE} + L_{SW} + L_{SE}$)
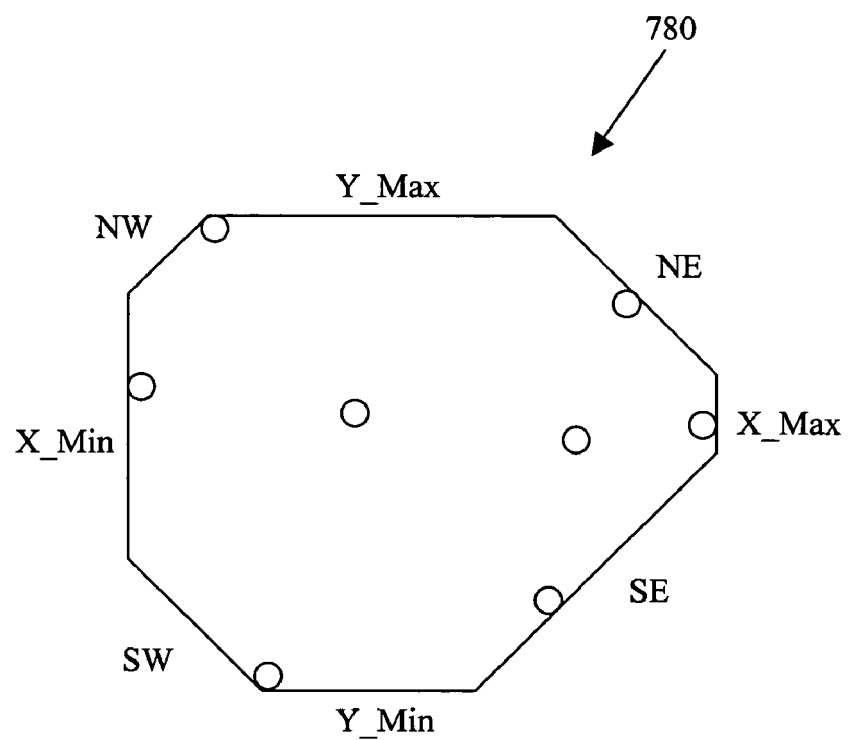
Fig. 7K - Estimate Wire Length

METHOD AND SYSTEM FOR IMPLEMENTING AN ANALYTICAL WIRELENGTH FORMULATION

BACKGROUND AND SUMMARY

The present invention relates to an improved method and system for estimating wire length values for an integrated circuit.

An integrated circuit ("IC") is a semiconductor device that includes many electronic components (e.g., transistors, resistors, diodes, etc.). These components are often interconnected to form multiple circuit components (e.g., gates, cells, memory units, arithmetic units, controllers, decoders, etc.) on the IC. The electronic and circuit components of IC's are jointly referred to below as "components."

An IC also includes multiple layers of metal and/or polysilicon wiring (collectively referred to below as "metal layers") that interconnect its electronic and circuit components. For instance, many IC's are currently fabricated with five to seven metal layers. In theory, the wiring on the metal layers can be all-angle wiring (i.e., the wiring can be in any arbitrary direction). Such all-angle wiring is commonly referred to as Euclidean wiring. In practice, however, each metal layer typically has a preferred wiring direction, and the preferred direction alternates between successive metal layers. Many IC's use the Manhattan wiring model, which specifies alternating layers of preferred-direction horizontal and vertical wiring. In this wiring model, the majority of the wires can only make 90 degree turns. However, occasional diagonal jogs are sometimes allowed on the preferred horizontal and vertical layers. Design engineers design IC's by transforming circuit description of the IC's into geometric descriptions, called layouts. To create layouts, design engineers typically use electronic design automation ("EDA") tools. These tools provide sets of computer-based applications for creating, editing, and analyzing IC design layouts.

IC's can also be fabricated with diagonal interconnect lines (i.e., diagonal wiring). In some of these embodiments, the IC layouts not only have diagonal interconnect lines, but also have horizontal and vertical interconnect lines. As used in this document, an interconnect line is "diagonal" if it forms an angle other than zero or ninety degrees with respect to one of the sides of the layout boundary. On the other hand, an interconnect line is "horizontal" or "vertical" if it forms an angle of 0 degree or 90 degree with respect to one of the sides of the layout.

FIG. 1 illustrates the wiring architecture (i.e., the interconnect-line architecture) of an IC layout 700 that utilizes horizontal, vertical, and 45 degrees diagonal interconnect lines. In this document, this architecture is referred to as the octagonal wiring model, in order to convey that an interconnect line can traverse in eight separate directions from any given point.

The horizontal lines 705 are the lines that are parallel (i.e., are at 0 degrees) to the x-axis, which is defined to be parallel to the width 710 of the layout. The vertical lines 715 are parallel to the y-axis, which is defined to be parallel to the height 720 of the layout. In other words, the vertical interconnect lines 715 are perpendicular (i.e., are at 90 degrees) to the width of the IC layout. In this architecture, one set 725 of diagonal lines are at +45 degrees with respect to the width of the IC layout, while another set 730 are at −45 degrees with respect to the width of the IC layout.

FIG. 2 illustrates one manner of implementing the wiring architecture illustrated in FIG. 1 on an IC. Specifically, FIG. 2 illustrates five metal layers for an IC. The first three layers 805–815 are Manhattan layers. In other words, the preferred direction for the wiring in these layers is either the horizontal direction or the vertical direction. The preferred wiring direction in the first three layers typically alternates so that no two consecutive layers have the same direction wiring. However, in some cases, the wiring in consecutive layers is in the same direction.

The next two layers 820 and 825 are diagonal layers. The preferred direction for the wiring in the diagonal layers is +/−45 degrees. Also, as in the first three layers, the wiring directions in the fourth and fifth layer are typically orthogonal (i.e., one layer is +45 degrees and the other is −45 degrees), although they do not have to be.

Even though some embodiments of the invention are described below to work with IC layouts that utilize the above-described octagonal wiring model, one of ordinary skill will understand that the invention can be used with any wiring model. For instance, the invention can be used with wiring architectures that are strictly diagonal (i.e., that do not have horizontal and vertical preferred direction wiring).

Also, some embodiments are used with non-45 degrees diagonal wiring. For example, some embodiments are used with IC layouts that have horizontal, vertical, +/−60 degrees, and/or +/−120 degrees diagonal interconnect lines.

EDA tools create layouts by using geometric shapes that represent different materials and devices on IC's. For instance, EDA tools commonly use rectangular lines to represent the wire segments that interconnect the IC components. These tools also represent electronic and circuit IC components as geometric objects with varying shapes and sizes. For the sake of simplifying the discussion, these geometric objects are shown as rectangular blocks in this document.

A net is typically defined as a collection of pins that need to be electrically connected. A list of all or some of the nets in a layout is referred to as a net list. In other words, a net list specifies a group of nets, which, in turn, specify the interconnections between a set of pins.

Placement is a key operation in the physical design cycle. It is the process of arranging the circuit modules on a layout, in order to achieve certain objectives, such as reducing layout area, wirelength, wire congestion, etc. A poor placement configuration not only can consume a large area, but it also can make routing difficult and result in poor performance.

Numerous EDA placers have been proposed to date. Certain placers are constrained-optimization placers, which (1) use cost-calculating functions to generate placement scores (i.e., placement costs) that quantify the quality of placement configurations, and (2) use optimization algorithms to modify iteratively the placement configurations to improve the placement scores generated by the cost-calculating functions.

A constrained-optimization placer typically receives (1) a list of circuit modules, (2) an initial placement configuration for these modules, and (3) a net list that specifies the interconnections between the modules. The initial placement configuration can be random (i.e., all the modules can be positioned randomly). Alternatively, the initial configuration can be partially or completely specified by a previous physical-design operation, such as the floor planning.

A constrained-optimization placer then uses a cost-calculating function to measure the quality of the initial placement configuration. The cost function generates a metric score that is indicative of the placement quality. Different cost-calculating functions measure different placement metrics. For instance, as further described below, some functions measure wirelength (e.g., measure each net's minimum spanning tree, Steiner tree, or bounding-box perimeter, etc.), while others measure congestion (e.g., measure number of nets intersected by cut lines).

After calculating the metric cost of the initial placement configuration, a constrained-optimization placer uses an optimization algorithm to modify iteratively the placement configuration to improve the placement score generated by its cost-calculating function. Different optimization techniques modify the placement configuration differently. For instance, at each iteration, some techniques move one circuit module, others swap two modules, and yet others move a number of related modules. Also, at each iteration, some optimization techniques (e.g., KLFM and tabu search algorithms) search for the best move, while others (e.g., simulated annealing and local optimization) select random moves. In addition, some techniques (e.g., simulated annealing) accept moves that make the metric score worse, whereas others (e.g., local optimization) do not.

One type of constrained-optimization placement techniques is the semi-perimeter method. The semi-perimeter method is a cost-calculating function used by some constrained-optimization techniques. This method quickly generates an estimate of the wirelength cost of a placement. For each net, this method typically (1) finds the smallest bounding-box that encloses all the net's pins, and (2) computes half the perimeter of this bounding rectangle.

FIG. 3 illustrates a rectangular bounding box 300 for a net that contains pins 302, 304, 306, 308, 310, 312, and 314. The computed semi-perimeter value of this box 300 equals the sum of its width x and height y. This computed semi-perimeter value provides a lower bound estimate on the amount of wire required to route a net. A bounding box with a diagonal attribute can also be used to estimate wirelength cost. U.S. Pat. No. 6,671,864 describes one example approach for using a bounding box with a diagonal attribute to estimate a wirelength cost for placement, and is incorporated herein by reference in its entirety.

The semi-perimeter method sums the semi-perimeter values of all the bounding rectangles of all the nets to obtain an estimated wirelength cost for a placement configuration. An optimization technique can then be used to modify iteratively the placement configuration to reduce this wirelength cost estimate, and thereby obtain an acceptable placement configuration.

Some embodiments of the present invention provide methods and systems for specifying an analytical wirelength formulation that is continuous along with its derivative. The approach performs a wirelength estimation in which a continuous formulation is employed to identify and use a bounding box to enclose circuit elements of a net, and in which an attribute of the bounding box may be completely or partially diagonal. Such formulations are used for optimizing the wirelength using numerical approaches.

Other and additional objects, features, and advantages of the invention are described in the detailed description, figures, and claims.

BRIEF DESCRIPTION OF THE DRAWINGS

The drawings illustrate the design and utility of embodiments of the present invention, in which similar elements are referred to by common reference numerals. In order to better appreciate the advantages and objects of a preferred embodiment, reference should be made to the accompanying drawings that illustrate this preferred embodiment. However, the drawings depict only one embodiment of the invention, and should not be taken as limiting its scope.

FIGS. 7A–K show an illustrated example of a process for performing wirelength analysis.

DETAILED DESCRIPTION

For IC layouts that utilize horizontal, vertical, and diagonal interconnect lines, some embodiments of the invention compute a wirelength-cost estimate for each net in a net list, by using a formulation that is continuous along with its derivative to: (1) identify a bounding box that encloses all the circuit elements of the net; and (2) determining the wirelength-cost estimate based upon the bounding box.

Figure 1:
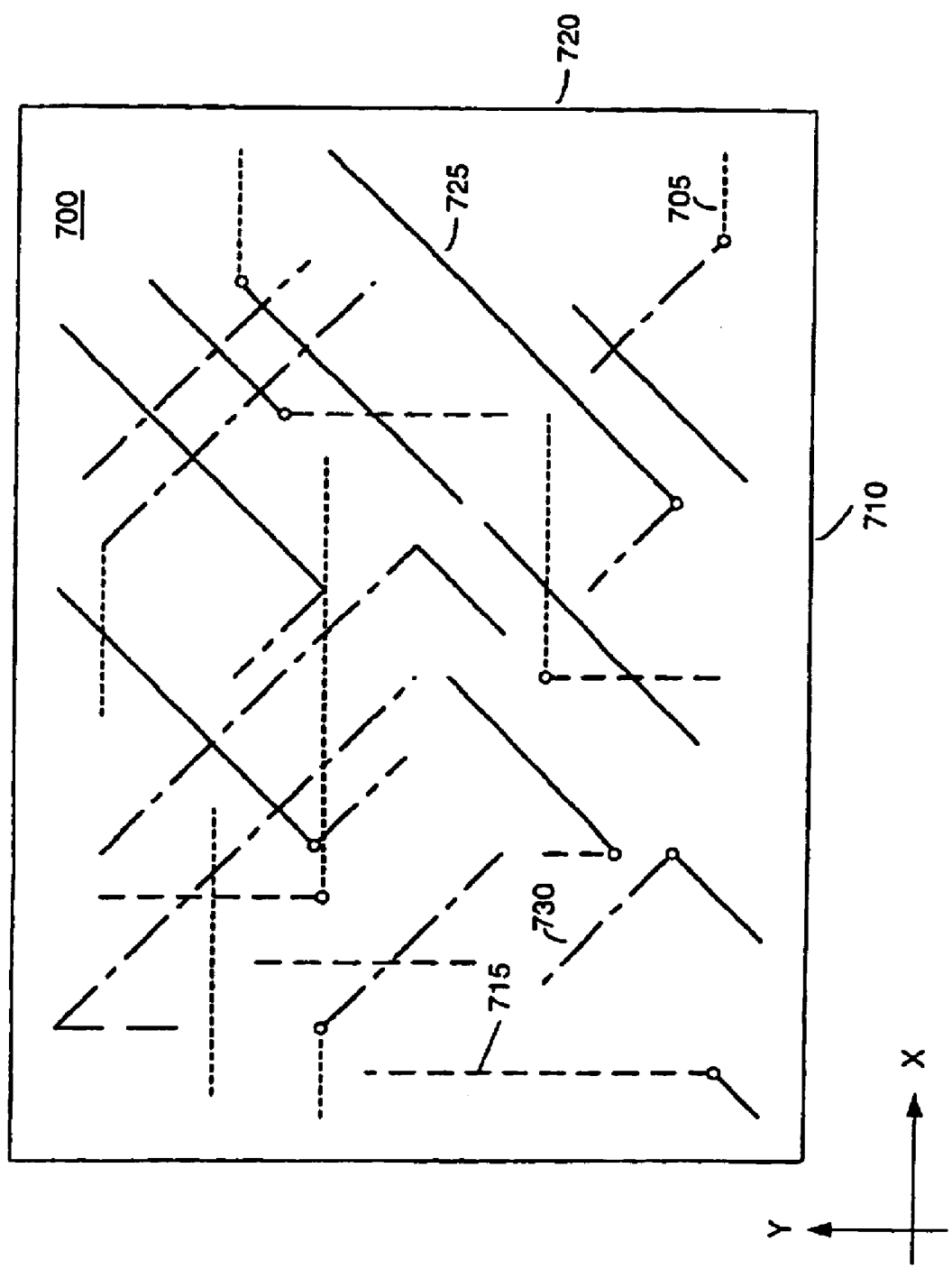
FIG. 1 illustrates the wiring architecture of an IC layout that utilizes horizontal, vertical, and 45 degrees diagonal interconnect lines.
Figure 2:
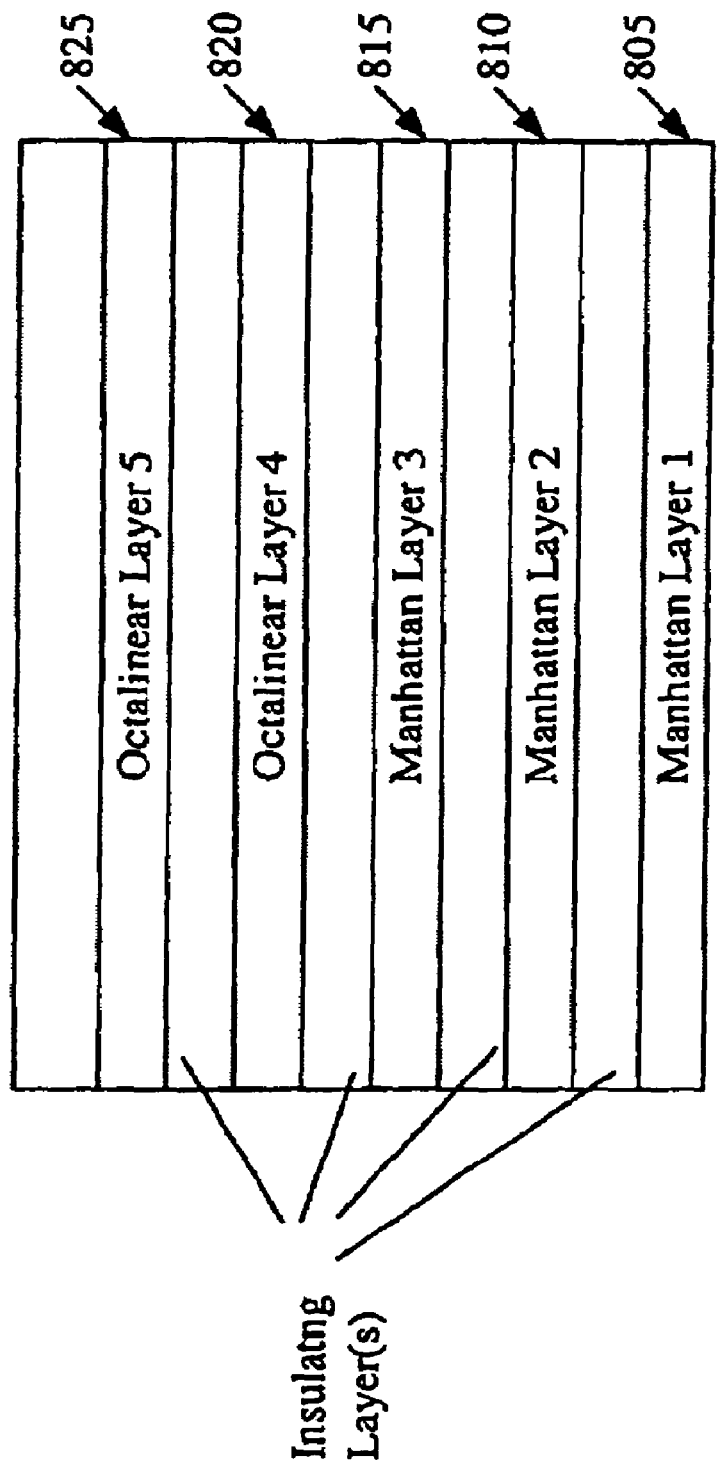
FIG. 2 illustrates multiple routing layers for an IC comprising horizontal, vertical, and 45 degrees diagonal routing directions.
Figure 3:
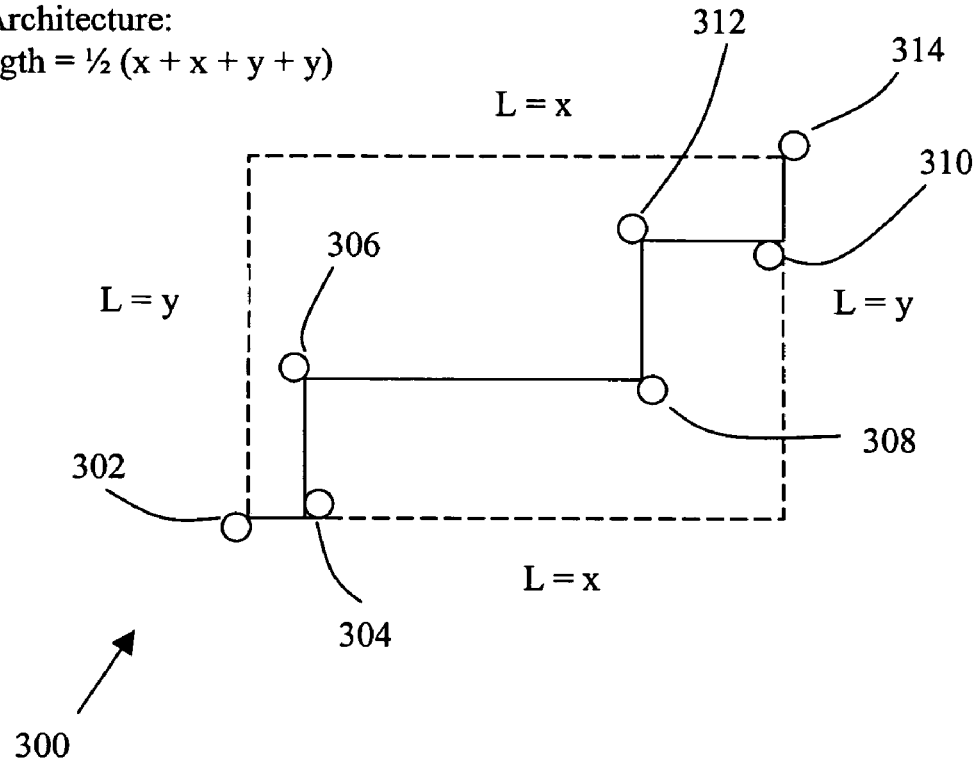
FIG. 3 shows a rectangular bounding box.
Figure 4:
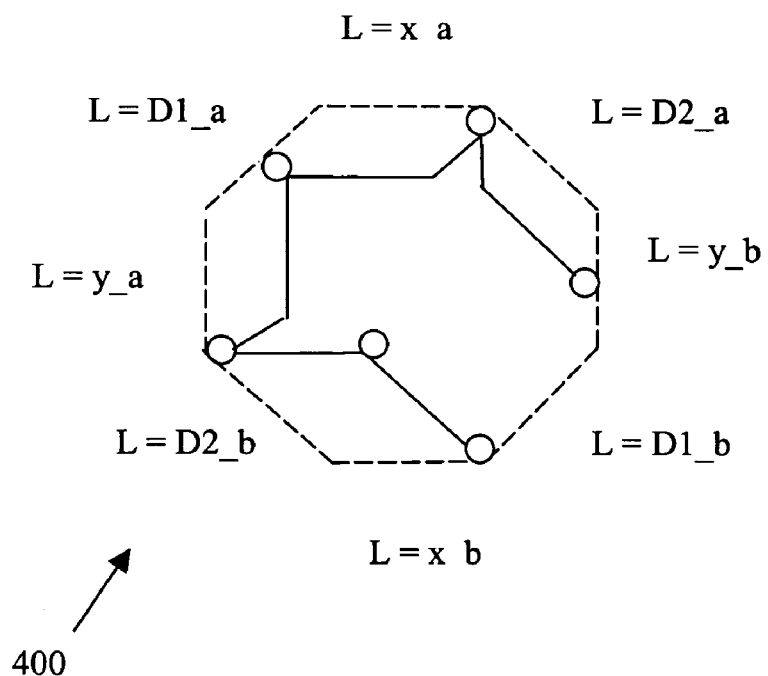
FIG. 4 shows an bounding box that includes at least one diagonal component.

FIG. 4 illustrates a bounding box 400 for a net which considers diagonal wiring in calculating a placement-configuration cost. In this approach, the wirelength cost of a placement configuration is estimated by (1) identifying, for each net in a net list, a bounding box that encloses all the circuit elements of the net, (2) computing an attribute of each bounding box by using a line that can be completely or partially diagonal, and (3) computing the wirelength cost estimate based on the computed attributes. In FIG. 4, an octagonal bounding box 400 has been constructed that encompasses the circuit elements to route in the net.

There are numerous ways to determine the boundaries of a bounding box. One approach is to compare each circuit element location in order for a particular boundary until a suitable boundary for the bounding box is identified. For example, to identify the minimum location along the x-axis of the bounding box, the x coordinate of each circuit element is compared (e.g., to each other or to an established minimum x coordinate value) until the minimum x value is found. If a bounding box is determined, but the location(s) of one or more circuit elements are changed, added, or deleted, then this type of element-by-element comparison must be performed again to determine the new boundaries of the bounding box.

An alternate approach is to use a formulation that is continuous to identify the boundary locations of the bounding box. In one embodiment, the formulation may be continuous along with its derivative. In contrast to the coordinate-by-coordinate approach previously described, this approach allows the boundaries of the bounding box to be determined mathematically using the continuous formulation.

Figure 5:
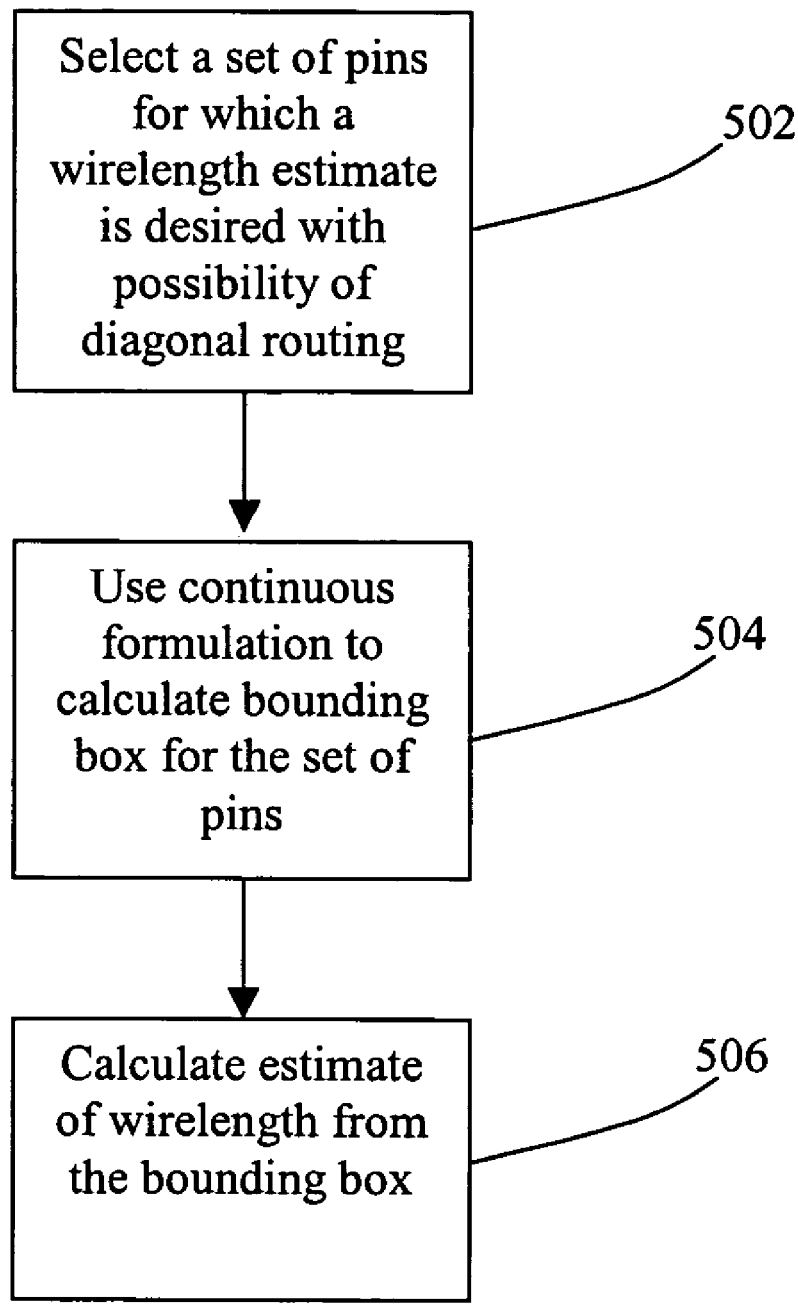
FIG. 5 shows a flowchart of a process for performing wirelength analysis that is continuous along with its derivative.

FIG. 5 shows a flowchart of a process for performing wirelength analysis that is continuous along with its derivative. The first action is to identify a set of elements/pins for which a wirelength estimate is desired and for which there is the possibility of routing in at least one diagonal direction (502). Each received net has several circuit elements associated with it (i.e., each net is defined to include several circuit elements). In other words, the nets on the net list specify the interconnection between some or all the circuit elements in the IC layout. In the embodiments described below, the circuit elements associated with the nets are the pins of the circuit modules in the IC layout. Other embodiments, however, treat the circuit modules as the circuit elements of the nets. Some of these embodiments treat the circuit modules as the net circuit elements and obviate the need to distinguish between the different pin locations, by assuming that the pins of each module are all located at uniform locations (e.g., located at the origin of the modules).

In some embodiments, the positions of the net circuit elements before the process starts define an initial placement configuration. In some of these embodiments, the initial circuit-element positions are random. In other embodiments, a previous physical-design operation, such as the floor planning, partially or completely specifies the initial positions of these elements. Other embodiments use another placer to specify the initial positions of the circuit elements, and then use process to optimize the placement configuration for a wiring architecture that uses diagonal wiring.

The next action is to use a continuous formulation to identify a bounding box for the set of pins (504). Further details regarding one embodiment of a process for specifying a formulation that is continuous along with its derivative is disclosed in more detail below in conjunction with FIG. 6.

One advantage of using a formulation that is continuous is that such a process can be more efficiently and automatically used in a solver for numerically computing an estimated wirelength, since the placement problem can be converted into a mathematical problem that can be solved using numerical optimization techniques.

As noted above, another advantage is that a bounding box can be efficiently and mathematically recalculated if the location of one or more circuit elements are changed, added, or removed, without requiring a point-by-point re-determination and comparison to identify the new boundaries of the bounding box.

According to one embodiment, this method generates an estimate of the wirelength cost of a placement by finding the smallest bounding-box that encloses all the net's pins, and computing half the perimeter of this bounding rectangle (506).

Figure 6:
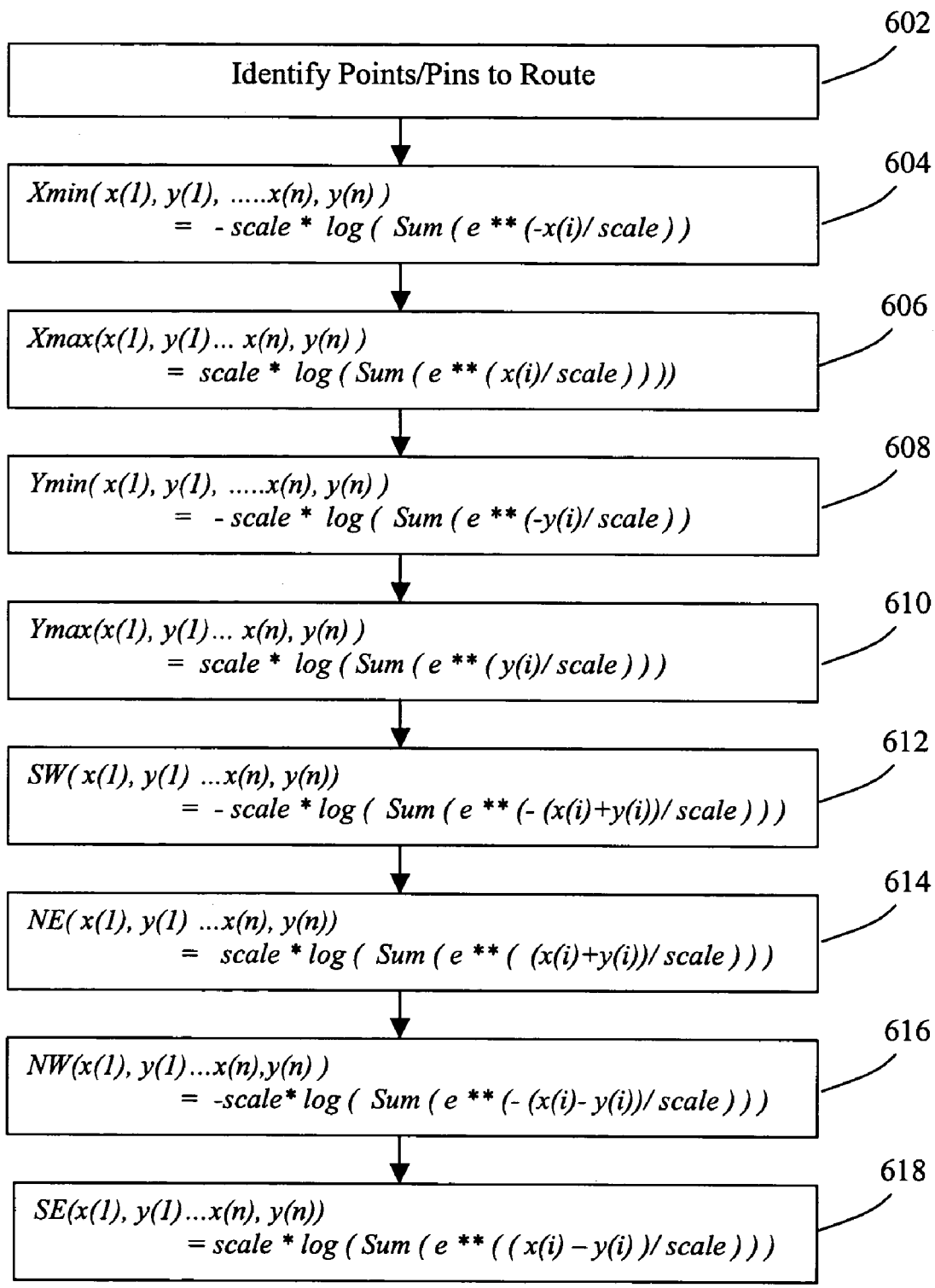
FIG. 6 shows a flowchart of a more detailed process for performing wirelength analysis that is continuous along with its derivative.

FIG. 6 shows a flowchart of a more detailed process for performing wirelength analysis that is continuous along with its derivative. This process is directed at an analytical estimation of the bounding box having diagonal attributes that considers all the layers as available globally. For purposes of this embodiment, consider an IC design having 2 Manhattan layers and 2 Diagonal layers. As previously described, the wirelength is then estimated as ½ of the X bounding box length.

For this process, assume that there are n points (x(i), y(i)) (602). The following functions are employed in the present embodiment:

$X\min(x(1),y(1), \ldots x(n),y(n)) = -scale*\log(Sum(e^{**}(-x(i)/scale)))$

This function determines the minimum position along the x-axis among the n points (x(i), y(i)) (604).

$X\max(x(1),y(1) \ldots x(n),y(n)) = scale*\log(Sum(e^{**}(x(i)/scale)))$

This function determines the minimum position along the x-axis among the n points (x(i), y(i))(606).

$Y\min(x(1),y(1) \ldots x(n),y(n)) = -scale*\log(Sum(e^{**}(-y(i)/scale)))$

This function determines the minimum position along the y-axis among the n points (x(i), y(i))(608).

$Y\max(x(1),y(1) \ldots x(n),y(n)) = scale*\log(Sum(e^{**}(y(i)/scale)))$

This function determines the maximum position along the y-axis among the n points (x(i), y(i))(610).

$SW(x(1),y(1) \ldots x(n),y(n)) = -scale*\log(Sum(e^{**}(-(x(i)+y(i))/scale)))$

This function determines the lowest-left position among the n points (x(i), y(i)) (612).

$NE(x(1),y(1) \ldots x(n),y(n)) = scale*\log(Sum(e^{**}((x(i)+y(i))/scale)))$

This function determines the Uppermost-right position among the n points (x(i), y(i)) (614).

$NW(x(1),y(1) \ldots x(n),y(n)) = -scale*\log(Sum(e^{**}(-(x(i)-y(i))/scale)))$

This function determines the Uppermost-left position among the n points (x(i), y(i)) (616).

$SE(x(1),y(1) \ldots x(n),y(n)) = scale*\log(Sum(e^{**}((x(i)-y(i))/scale)))$

This function determines the lowest-right position among the n points (x(i), y(i)) (618).

It is noted that the present application uses various terms to describe orientation, such as "upper", "lower", "left", "right", "vertical", and "horizontal". These terms are used only for illustrative purposes, to more easily facilitate a description of the examples. No limitation as to the invention is intended by using these terms.

An illustrated example will now be presented to describe how these functions are used to determine a wirelength estimate.

FIG. 7A shows an example set of pins to route together for a hypothetical IC layout. The example set of pins include pins 750, 752, 754, 756, 758, 760, and 762. Assume that the x-axis is along the horizontal direction and the y-axis is along the vertical direction of the page.

Figure 7B:
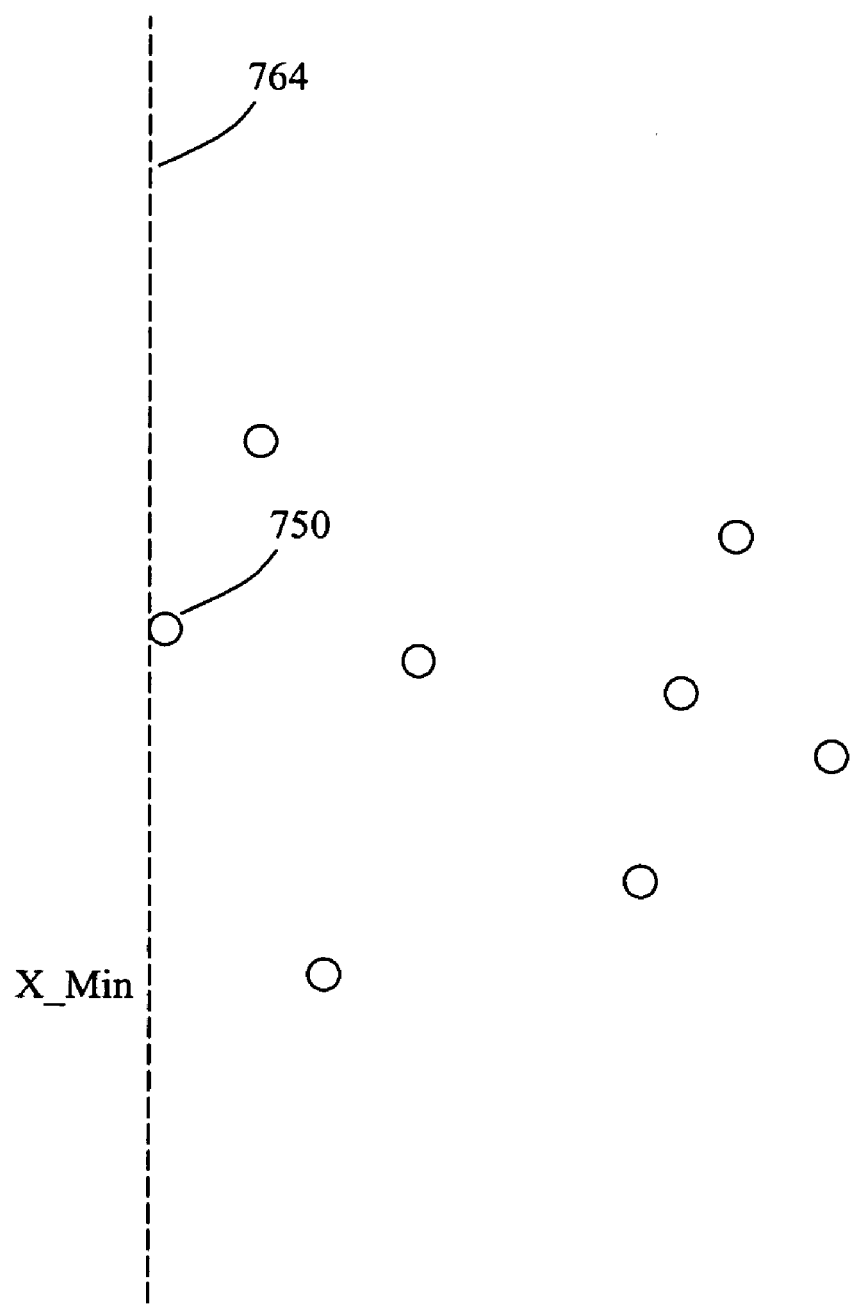

Referring to FIG. 7B, the minimum x position among the set of pins will now be identified. This minimum x position will form the left-most boundary of the smallest bounding box that can be used to enclose the set of pins 750, 752, 754, 756, 758, 760, and 762.

As noted above, applying the function:

$X\min(x(1),y(1) \ldots x(n),y(n)) = -scale*\log(Sum(e^{}(-x(i)/scale)))$ to the locations of these pins will identify the minimum position along the X-axis among this set of pins in a continuous manner along with its derivative. Here, the x location of pin 750 is seen to have the minimum x location. A dashed line 764** perpendicular to the X-axis has been drawn to indicate this position along the X-axis.

Figure 7C:
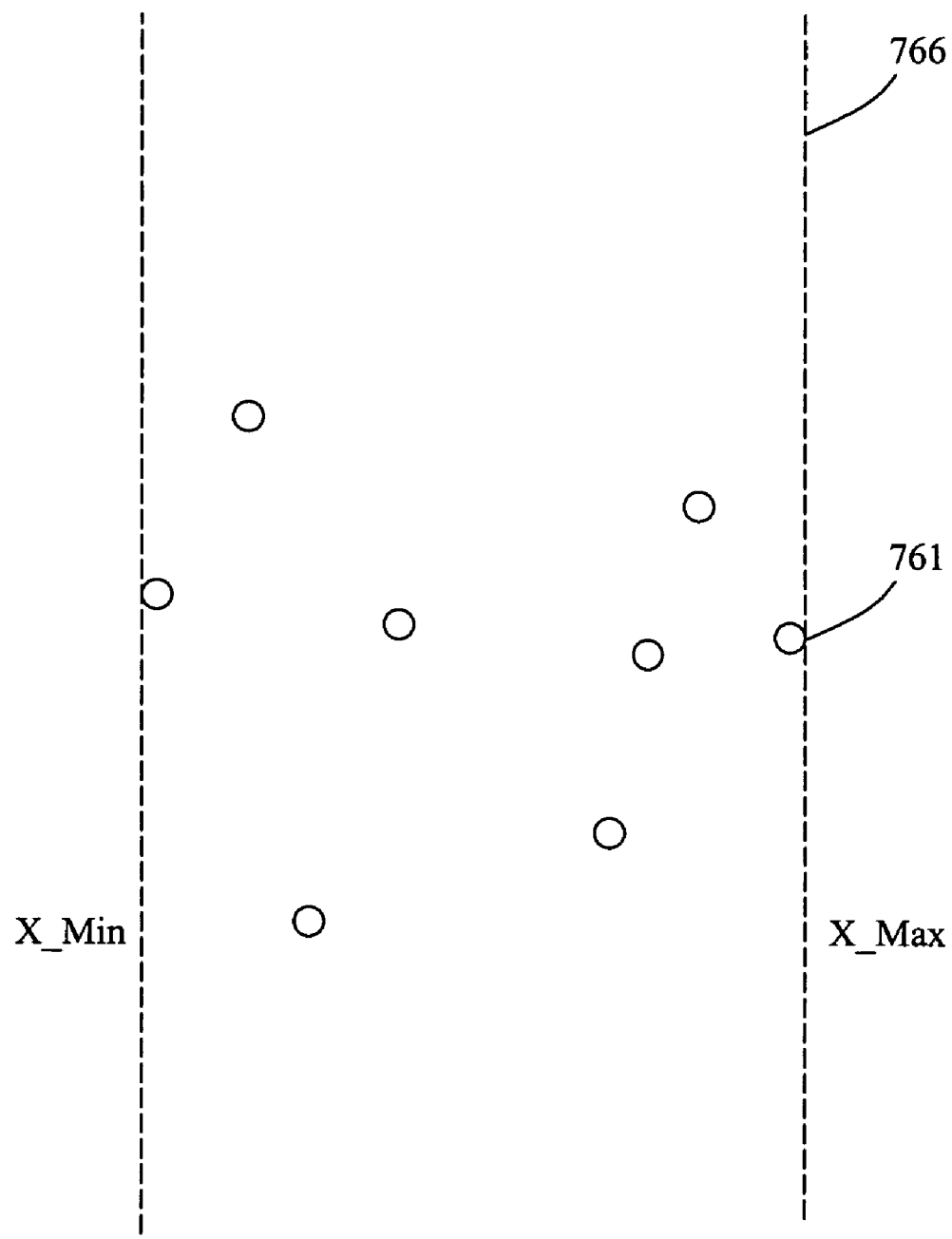

Referring to FIG. 7C, the maximum x position among the set of pins will now be identified. This maximum x position will form the right-most boundary of the smallest bounding box that can be used to enclose the set of pins 750, 752, 754, 756, 758, 760, and 762.

As noted above, applying the function:

$$Xmax(x(1),y(1) \ldots x(n),y(n)) = scale*\log(Sum(e^{**}(x(i)/scale)))$$

to the locations of these pins will identify the maximum position along the X-axis among this set of pins in a continuous manner along with its derivative. Here, the x location of pin 761 is seen to have the maximum x location. A dashed line 766 perpendicular to the X-axis has been drawn to indicate this position along the X-axis.

Figure 7D:
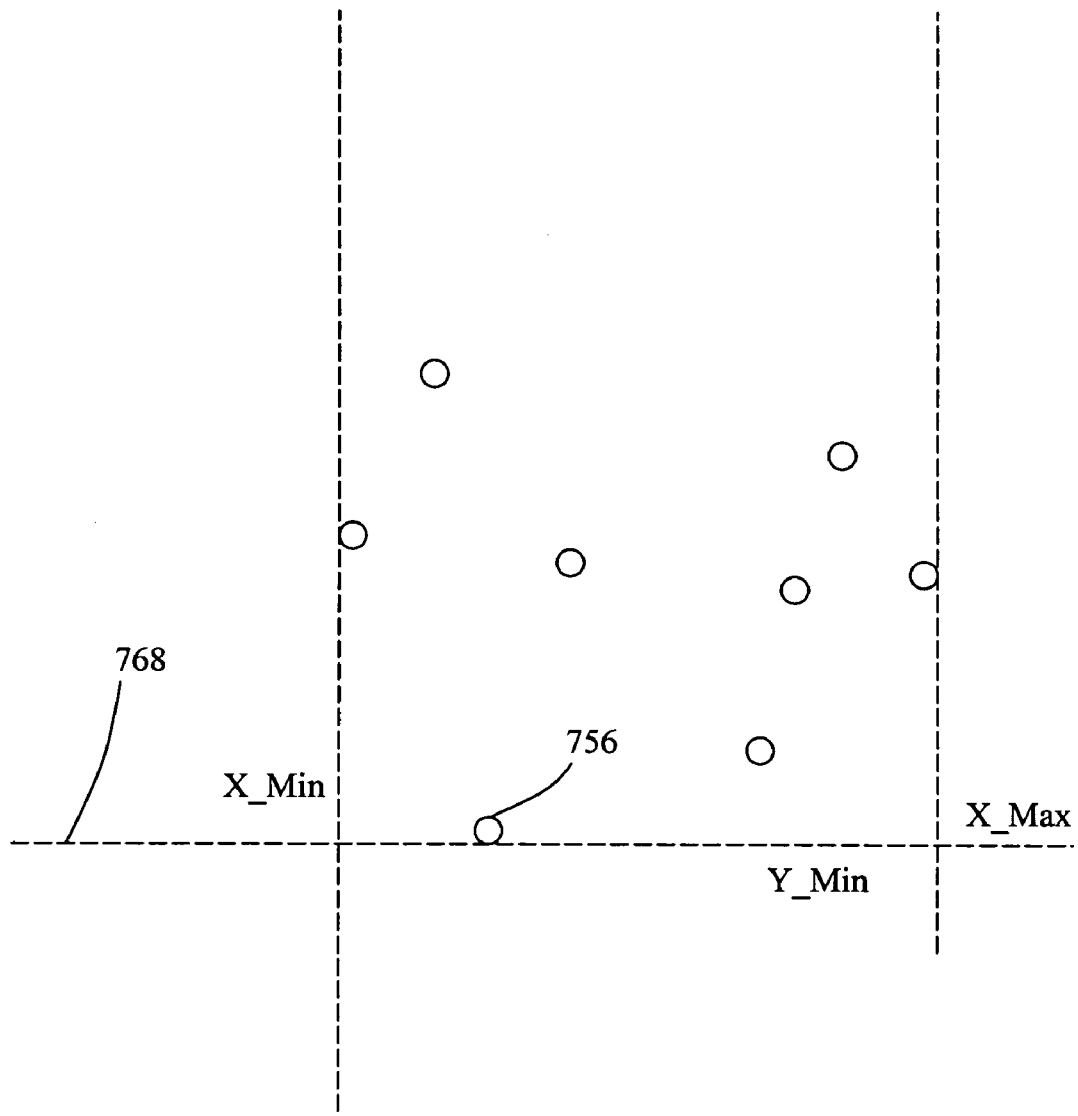

Referring to FIG. 7D, the minimum y position among the set of pins will now be identified. This minimum y position will form the lower boundary of the smallest bounding box that can be used to enclose the set of pins 750, 752, 754, 756, 758, 760, and 762.

As noted above, applying the function:

$$Ymin(x(1),y(1) \ldots x(n),y(n)) = -scale*\log(Sum(e^{**}(-y(i)/scale)))$$

to the locations of these pins will identify the minimum position along the Y-axis among this set of pins in a continuous manner along with its derivative. Here, the y location of pin 756 is seen to have the minimum x location. A dashed line 768 perpendicular to the Y-axis has been drawn to indicate this position along the Y-axis.

Figure 7E:
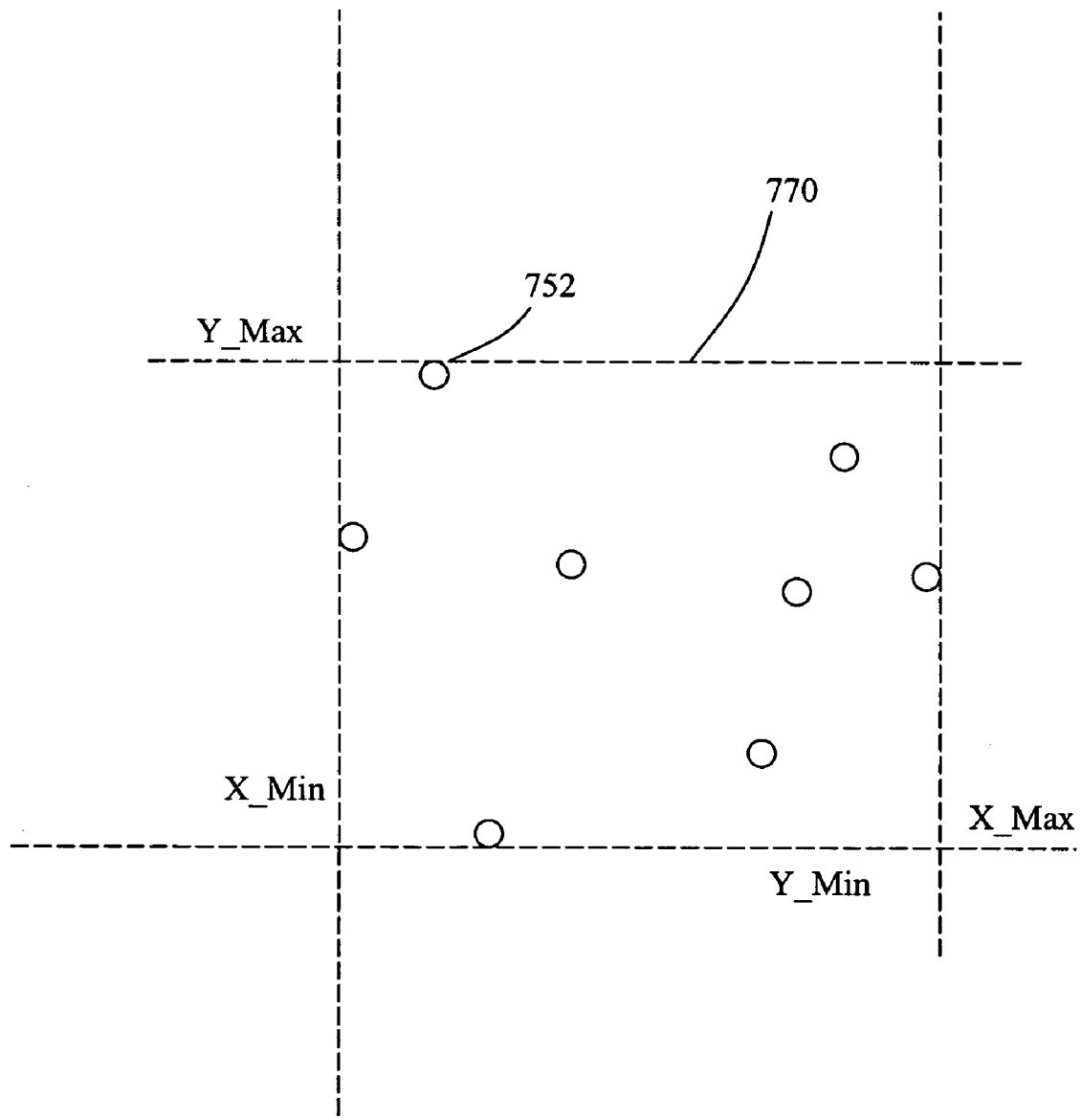

Referring to FIG. 7E, the maximum y position among the set of pins will now be identified. This maximum y position will form the highest boundary of the smallest bounding box that can be used to enclose the set of pins 750, 752, 754, 756, 758, 760, and 762.

As noted above, applying the function:

$$Ymax(x(1),y(1) \ldots x(n),y(n)) = scale*\log(Sum(e^{**}(y(i)/scale)))$$

to the locations of these pins will identify the maximum position along the Y-axis among this set of pins in a continuous manner along with its derivative. Here, they location of pin 752 is seen to have the maximum y location. A dashed line 770 perpendicular to the Y-axis has been drawn to indicate this position along the Y-axis.

Figure 7F:
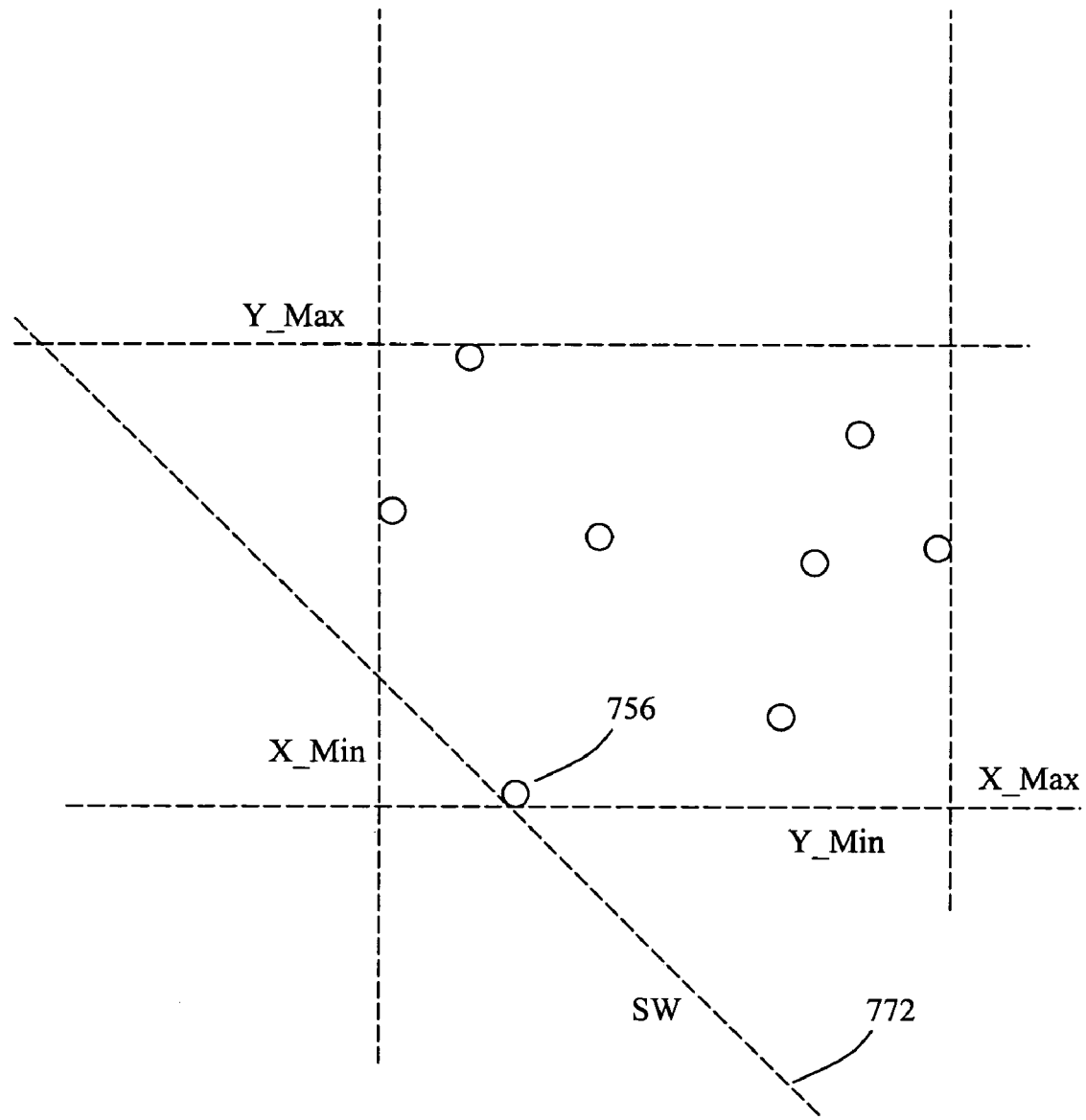

Referring to FIG. 7F, the lowest-left position among the set of pins will now be identified, which is also referred to herein as the "Southwest" or "SW" position. This SW position will form the lower-left diagonal boundary of the smallest bounding box that can be used to enclose the set of pins 750, 752, 754, 756, 758, 760, and 762.

As noted above, applying the function:

$$SW(x(1),y(1) \ldots x(n),y(n)) = -scale*\log(Sum(e^{**}(-(x(i)+y(i))/scale)))$$

to the locations of these pins will identify the SW position among this set of pins in a continuous manner along with its derivative. Here, the location of pin 756 is seen to have the lowest-left location. A dashed line 772 has been drawn along the preferred diagonal routing direction (e.g., −45 degrees diagonal) through this identified position.

Figure 7G:
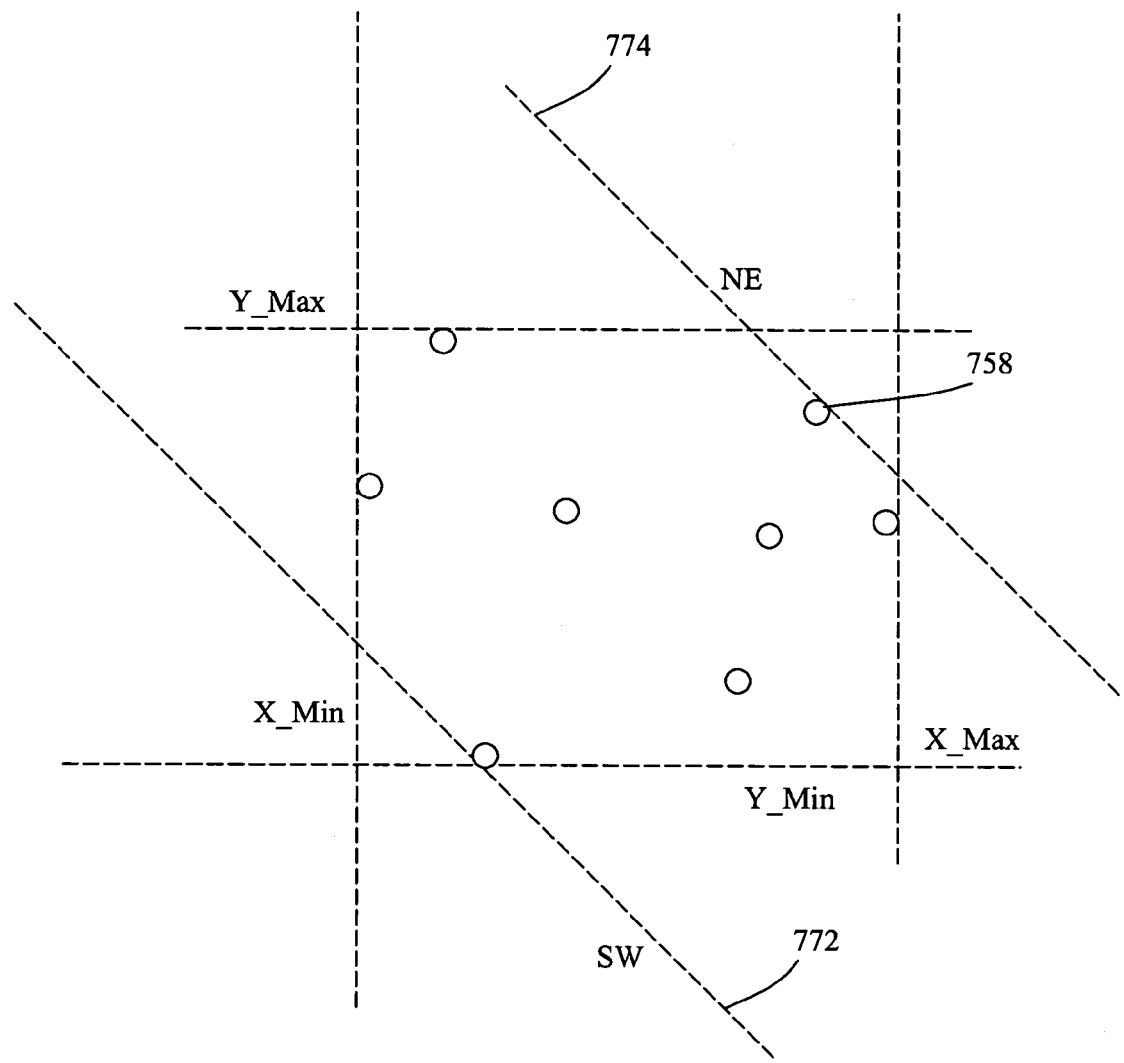

Referring to FIG. 7G, the uppermost-right position among the set of pins will now be identified, which is also referred to herein as the "Northeast" or "NE" position. This NE position will form the upper-right diagonal boundary of the smallest bounding box that can be used to enclose the set of pins 750, 752, 754, 756, 758, 760, and 762.

As noted above, applying the function:

$$NE(x(1),y(1) \ldots x(n),y(n)) = scale*\log(Sum(e^{**}((x(i)+y(i))/scale)))$$

to the locations of these pins will identify the NE position among this set of pins in a continuous manner along with its derivative. Here, the location of pin 758 is seen to have the uppermost-right location. A dashed line 774 has been drawn along the preferred diagonal routing direction (e.g., −45 degrees diagonal) through this identified position, and in the same direction as the SW line 772.

Figure 7H:
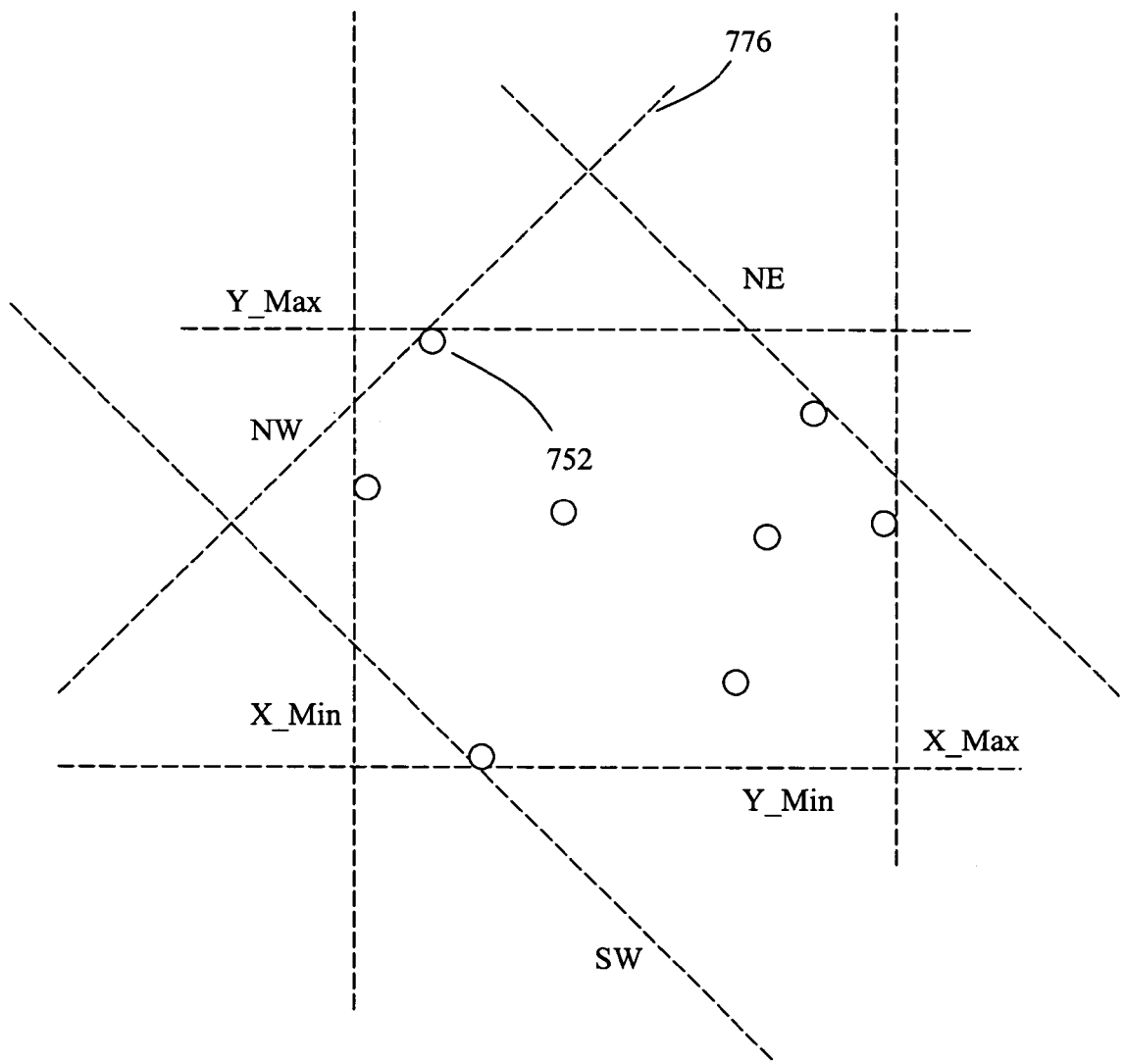
Figure 7I:
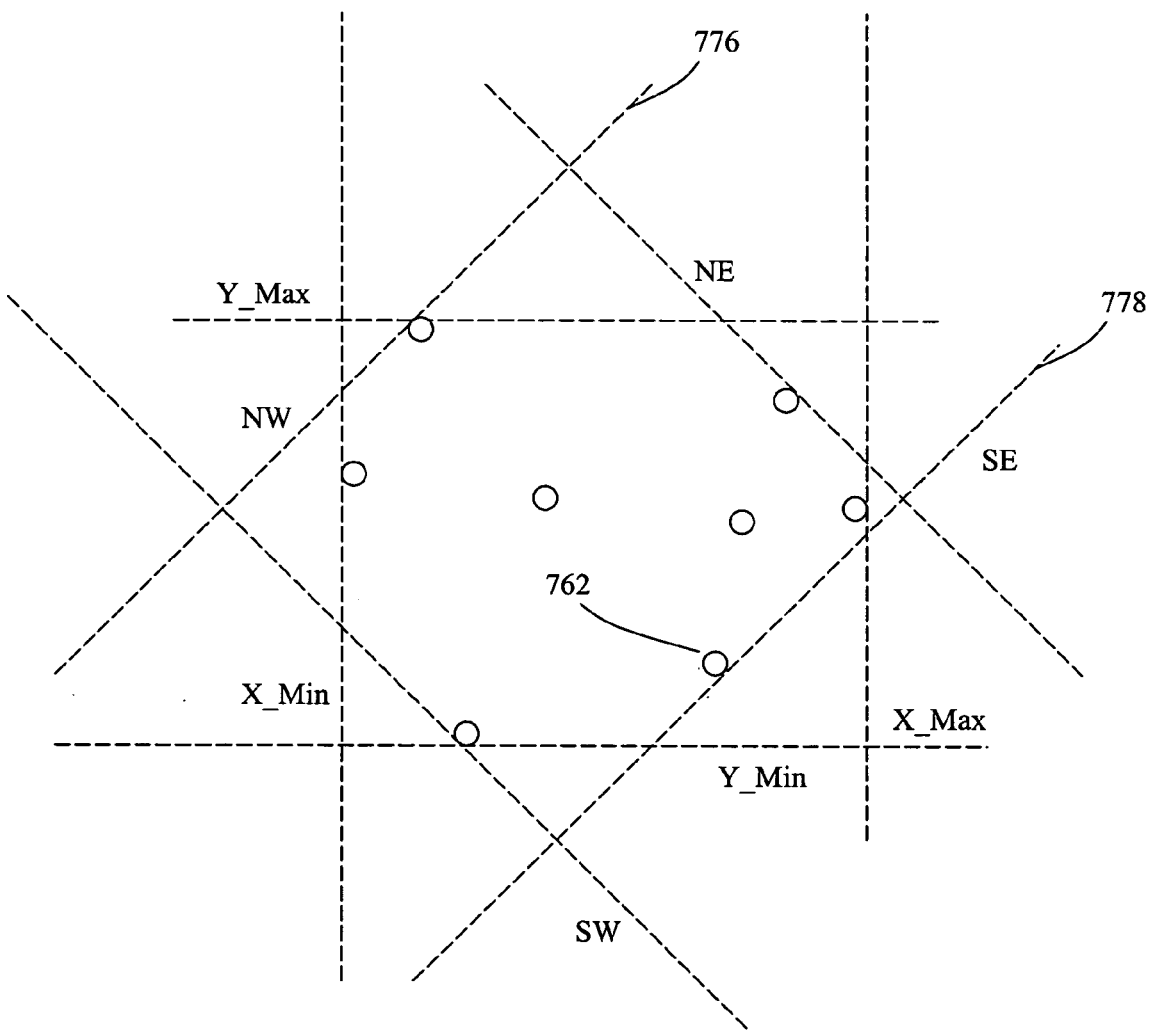

Referring to FIG. 7H, the uppermost-left position among the set of pins will now be identified, which is also referred to herein as the "Northwest" or "NW" position. This NW position will form the upper-left diagonal boundary of the smallest bounding box that can be used to enclose the set of pins 750, 752, 754, 756, 758, 760, and 762.

As noted above, applying the function:

$$NW(x(1),y(1) \ldots x(n),y(n)) = -scale*\log(Sum(e^{**}(-(x(i)-y(i))/scale)))$$

to the locations of these pins will identify the NW position among this set of pins in a continuous manner along with its derivative. Here, the location of pin 752 is seen to have the uppermost-left location. A dashed line 776 has been drawn along the preferred diagonal routing direction (e.g., +45 degrees diagonal) through this identified position.

Referring to FIG. 7F, the lowest-right position among the set of pins will now be identified, which is also referred to herein as the "Southeast" or "SE" position. This SE position will form the lower-right diagonal boundary of the smallest bounding box that can be used to enclose the set of pins 750, 752, 754, 756, 758, 760, and 762.

As noted above, applying the function:

$$SE(x(1),y(1) \ldots x(n), y(n)) = scale*\log(Sum(e^{**}((x(i)-y(i))/scale)))$$

to the locations of these pins will identify the SE position among this set of pins in a continuous manner along with its derivative. Here, the location of pin 762 is seen to have the lowest-right location. A dashed line 778 has been drawn along the preferred diagonal routing direction (e.g., +45 degrees diagonal) through this identified position, and in the same direction as the SW line 776.

At this point, it can be seen that the intersecting lines form a bounding box in the shape of an octagon around the pins 750, 752, 754, 756, 758, 760, and 762, as shown in solid lines in FIG. 7J. It is also noted that the locations of one or more pins in the set may not form a boundary of the octagonal bounding box. For example, pins 754 and 760 are located within the interior of the bounding box, and therefore their (x,y) locations do not contribute to the location of the boundary of the bounding box 780.

Referring to FIG. 7K, removing the extraneous dashed portions of the lines reveals the contours of the bounding box 780 around the pins 750, 752, 754, 756, 758, 760, and 762. The estimated wirelength for this set of pins can then be estimated by calculating ½ of the lengths of the sides of the octagonal bounding box 780:

$$Est.Wirelength = \tfrac{1}{2}(L_{Y\_max}+L_{Y\_min}+L_{X\_max}+L_{X\_min}+L_{NW}+L_{NE}+L_{SW}+L_{SE})$$

Mathematically, the following function can be used to determine the bounding box length (in which each pair of lines corresponds to an edge on octagonal bounding box):

$$BBox(x(1),y(1) \ldots x(n),y(n)) =$$

$$sqrt(2)*(SW(x(1),y(1) \ldots x(n),y(n)) - Xmin(x(1),y(1) \ldots x(n),y(n)) - Ymin(x(1),y(1) \ldots x(n),y(n))) +$$

$$(SE(x(1),y(1) \ldots x(n),y(n))-SW(x(1),y(1) \ldots x(n),y(n))+2*Y\min(x(1),y(1) \ldots x(n),y(n)))+$$

$$sqrt(2)*(X\max(x(1),y(1) \ldots x(n),y(n))-Y\min(x(1),y(1) \ldots x(n),y(n))-SE(x(1),y(1) \ldots x(n),y(n))+$$

$$(NE(x(1),y(1) \ldots x(n),y(n))+SE(x(1),y(1) \ldots x(n),y(n))-2*X\max(x(1),y(1) \ldots x(n),y(n)))+$$

$$sqrt(2)*(NE(x(1),y(1) \ldots x(n),y(n))-X\max(x(1),y(1) \ldots x(n),y(n))-Y\max(x(1),y(1) \ldots x(n),y(n)))+$$

$$(NE(x(1),y(1) \ldots x(n),y(n))-NW(x(1),y(1) \ldots x(n),y(n))-2*Y\max(x(1),y(1) \ldots x(n),y(n)))+$$

$$sqrt(2)*(NW(x(1),y(1) \ldots x(n),y(n))-X\min(x(1),y(1) \ldots x(n),y(n))+Y\max(x(1),y(1) \ldots x(n),y(n)))+$$

$$(2*X\min(x(1),y(1) \ldots x(n),y(n))-NW(x(1),y(1) \ldots x(n),y(n))-SW(x(1),y(1), \ldots x(n),y(n)))$$

This function can be simplified as followed:

½XBounding Box length=

$$(sqrt(2)-1)(X\max(x(1),y(1) \ldots x(n),y(n))-X\min(x(1),y(1) \ldots x(n),y(n))+Y\max(x(1),y(1) \ldots x(n),y(n))-Y\min(x(1),y(1) \ldots x(n),y(n)))+$$

$$(1-(1/sqrt(2)))(NE(x(1),y(1) \ldots x(n),y(n))-SW(x(1),y(1) \ldots x(n),y(n))+SE(x(1),y(1) \ldots x(n),y(n))-NW(x(1),y(1) \ldots x(n),y(n)))$$

This ends up being a weighted sum of the regular rectangular bounding box and the diagonal bounding box for a set of pins.

After obtaining the wirelength cost of the initial placement configuration, some embodiments use an optimization process that iteratively modifies the placement configuration to improve the placement-configuration cost. In some embodiments, the optimization process uses the process to calculate the placement-configuration cost for each possible iterative modification to the placement configuration. This is further described below in U.S. Pat. No. 6,671,864, which is incorporated herein by reference in its entirety.

The present invention can be realized in hardware, software, or a combination of hardware and software. A system according to a preferred embodiment of the present invention can be realized in a centralized fashion in one computer system, or in a distributed fashion where different elements are spread across several interconnected computer systems. Any kind of computer system—or other apparatus adapted for carrying out the methods described herein—is suited. A typical combination of hardware and software could be a general-purpose computer system with a computer program that, when being loaded and executed, controls the computer system such that it carries out the methods described herein.

The present invention can also be embedded in a computer program product, which comprises all the features enabling the implementation of the methods described herein, and which—when loaded in a computer system—is able to carry out these methods. Computer program means or computer program in the present context mean any expression, in any language, code or notation, of a set of instructions intended to cause a system having an information processing capability to perform a particular function either directly or after either or both of the following a) conversion to another language, code or, notation; and b) reproduction in a different material form.

A computer system may include, inter alia, one or more computers and at least a computer usable/readable medium, allowing a computer system, to read data, instructions, messages or message packets, and other computer readable information from the computer readable medium. The computer readable medium may include non-volatile memory, such as ROM, Flash memory, Disk drive memory, CD-ROM, and other permanent storage. Additionally, a computer readable medium may include, for example, volatile storage such as RAM, buffers, cache memory, and network circuits. Furthermore, the computer readable medium may comprise computer readable information in a transitory state medium such as a network link and/or a network interface, including a wired network or a wireless network, that allow a computer system to read such computer readable information.

In alternative embodiments, hard-wired circuitry may be used in place of or in combination with software instructions to implement the invention. Thus, embodiments of the invention are not limited to any specific combination of hardware circuitry and/or software. In one embodiment, the term "logic" shall mean any combination of software or hardware that is used to implement all or part of the invention.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method of estimating an interconnect line length to connect circuit elements of a net in an integrated circuit ("IC") layout, the net representing interconnections between a set of circuit elements in the IC layout, the method comprising:

(a) identifying a plurality of circuit elements for the net, wherein at least one diagonal routing direction is available to route the interconnections between the plurality of circuit elements;

(b) determining a bounding box that encompasses the plurality of circuit elements of the net, wherein the boundaries of the bounding box are determined using a continuous formulation; and (c) using the bounding box to estimate the interconnect line length to connect the circuit elements of the net.

2. The method of claim 1 in which the boundaries of the bounding box are determined using at least one of the following functions:

$$X\min(x(1),y(1), \ldots x(n),y(n))=-scale*\log(Sum(e^{**}(-x(i)/scale))$$

$$X\max(x(1),y(1) \ldots x(n),y(n))=scale*\log(Sum(e^{**}(x(i)/scale)))$$

$$Y\min(x(1),y(1) \ldots x(n),y(n))=-scale*\log(Sum(e^{**}(-y(i)/scale)))$$

$$Y\max(x(1),y(1) \ldots x(n),y(n))=scale*\log(Sum(e^{**}(y(i)/scale)))$$

$$SW(x(1),y(1) \ldots x(n),y(n))=scale*\log(Sum(e^{**}((x(i)+y(i))/scale)))$$

$NE(x(1),y(1) \ldots$
$\quad x(n),y(n))=scale*log(Sum(e^{**}((x(i)+y(i))/scale)))$ $NW(x(1),y(1) \ldots$
$\quad x(n),y(n))=-scale*log(Sum(e^{**}(-(x(i)-y(i))/scale)))$ $SE(x(1),y(1) \ldots$
$\quad x(n),y(n))=scale*log(Sum(e^{**}((x(i)-y(i))/scale)))$.

3. The method of claim 2 in which the bounding box length is determined using the following function:

$BBox(x(1),y(1) \ldots x(n),y(n))=$ $=sqrt(2)*(SW(x(1),y(1) \ldots$
$\quad x(n),y(n))-X\min(x(1),y(1) \ldots$
$\quad x(n),y(n))-Y\min(x(1),y(1) \ldots x(n),y(n)))+$ $(SE(x(1),y(1) \ldots x(n),y(n))-SW(x(1),y(1) \ldots$
$\quad x(n),y(n))+2*Y\min(x(1),y(1) \ldots x(n),y(n)))+$ $sqrt(2)*(X\max(x(1),y(1) \ldots$
$\quad x(n),y(n))-Y\min(x(1),y(1) \ldots$
$\quad x(n),y(n))-SE(x(1),y(1) \ldots x(n),y(n))+$ $(NE(x(1),y(1) \ldots x(n),y(n))+SE(x(1),y(1) \ldots$
$\quad x(n),y(n))-2*X\max(x(1),y(1) \ldots x(n),y(n)))+$ $sqrt(2)*(NE(x(1),y(1) \ldots$
$\quad x(n),y(n))-X\max(x(1),y(1) \ldots$
$\quad x(n),y(n))-Y\max(x(1),y(1) \ldots x(n),y(n)))+$ $(NE(x(1),y(1) \ldots x(n),y(n))-NW(x(1),y(1) \ldots$
$\quad x(n),y(n))-2*Y\max(x(1),y(1) \ldots x(n),y(n)))+$ $sqrt(2)*(NW(x(1),y(1) \ldots$
$\quad x(n),y(n))-X\min(x(1),y(1) \ldots$
$\quad x(n),y(n))+Y\max(x(1),y(1) \ldots x(n),y(n)))+$ $(2*X\min(x(1),y(1), \ldots x(n),y(n))-NW(x(1),y(1) \ldots$
$\quad x(n),y(n))-SW(x(1),y(1), \ldots x(n),y(n)))$.

4. The method of claim 2 in which the bounding box length is determined using the following function:

½×Bounding Box length=

$(sqrt(2)-1)(X\max(x(1),y(1) \ldots x(n),y(n))-X\min(x(1),$
$\quad y(1) \ldots x(n),y(n))+Y\max(x(1),y(1) \ldots x(n),y$
$\quad (n))-Y\min(x(1),y(1) \ldots x(n),y(n)))+$ $(1-(1/sqrt(2))) (NE(x(1),y(1) \ldots x(n),y(n))-SW(x(1),$
$\quad y(1) \ldots x(n),y(n))+SE(x(1),y(1) \ldots x(n),y(n))-$
$\quad NW(x(1),y(1) \ldots x(n),y(n)))$.

5. The method of claim 1, in which the interconnect line length is estimated as ½ the length of the boundaries of the bounding box.

6. The method of claim 1, wherein the estimate of the interconnect line length is measured to obtain a placement cost of an initial placement configuration.

7. The method of claim 1 further comprising:
    (a) modifying the position of at least one circuit elements of the net; and
    (b) constructing a second bounding box that encompasses the circuit elements of the net; and
    (c) obtaining a second estimate of the interconnect line length needed to connect the circuit elements of the net.

8. The method of claim 1, wherein the at least one diagonal routing direction forms a 45, 60, or 120 degree angle with respect to a side of the IC layout.

9. The method of claim 1, wherein the circuit elements include pins of circuit modules.

10. The method of claim 1 in which the bounding box is determined using a formulation that is continuous along with its derivative.

11. A computer program product comprising a computer usable medium having executable code to execute a method for estimating an interconnect line length to connect circuit elements of a net in an integrated circuit ("IC") layout, the net representing interconnections between a set of circuit elements in the IC layout, the method comprising:
    (a) identifying a plurality of circuit elements for the net, wherein at least one diagonal routing direction is available to route the interconnections between the plurality of circuit elements;
    (b) determining a bounding box that encompasses the plurality of circuit elements of the net, wherein the boundaries of the bounding box are determined using a continuous formulation; and
    (c) using the bounding box to estimate the interconnect line length to connect the circuit elements of the net.

12. The computer program product of claim 11 in which the boundaries of the bounding box are determined using at least one of the following functions:

$X\min(x(1),y(1) \ldots$
$\quad x(n),y(n))=-scale*log(Sum(e^{**}(-x(i)/scale))$ $X\max(x(1),y(1) \ldots$
$\quad x(n),y(n))=scale*log(Sum(e^{**}(x(i)/scale)))$ $Y\min(x(1),y(1) \ldots$
$\quad x(n),y(n))=-scale*log(Sum(e^{**}(-y(i)/scale))$ $Y\max(x(1),y(1) \ldots$
$\quad x(n),y(n))=scale*log(Sum(e^{**}(y(i)/scale)))$ $SW(x(1),y(1) \ldots$
$\quad x(n),y(n))=-scale*log(Sum(e^{**}(-(x(i)+y(i))/scale)))$ $NE(x(1),y(1) \ldots$
$\quad x(n),y(n))=scale*log(Sum(e^{**}((x(i)+y(i))/scale)))$ $NW(x(1),y(1) \ldots$
$\quad x(n),y(n))=-scale*log(Sum(e^{**}(-(x(i)-y(i))/scale)))$ $SE(x(1),y(1) \ldots$
$\quad x(n),y(n))=scale*log(Sum(e^{**}((x(i)-y(i))/scale)))$.

13. The computer program product of claim 11, in which the interconnect line length is estimated as ½ the length of the boundaries of the bounding box.

14. The computer program product of claim 11 further comprising:
    (a) modifying the position of at least one circuit elements of the net; and
    (b) constructing a second bounding box that encompasses the circuit elements of the net; and
    (c) obtaining a second estimate of the interconnect line length needed to connect the circuit elements of the net.

15. The computer program product of claim 11, wherein the at least one diagonal routing direction forms a 45, 60, or 120 degree angle with respect to a side of the IC layout.

16. A system for estimating an interconnect line length to connect circuit elements of a net in an integrated circuit ("IC") layout, the net representing interconnections between a set of circuit elements in the IC layout, the method comprising:
    (a) logic for identifying a plurality of circuit elements for the net, wherein at least one diagonal routing direction is available to route the interconnections between the plurality of circuit elements;
    (b) logic for determining a bounding box that encompasses the plurality of circuit elements of the net, wherein the boundaries of the bounding box are determined using a continuous formulation; and (c) logic for using the bounding box to estimate the interconnect line length to connect the circuit elements of the net.

17. The system of claim 16 in which the boundaries of the bounding box are determined using at least one of the following functions:

$Xmin(x(1),y(1) \ldots x(n),y(n)) = -scale*\log(Sum(e^{**}(-x(i)/scale))$ $Xmax(x(1),y(1) \ldots x(n),y(n)) = scale*\log(Sum(e^{**}(x(i)/scale)))$ $Ymin(x(1),y(1) \ldots x(n),y(n)) = -scale*\log(Sum(e^{**}(-y(i)/scale)))$ $Ymax(x(1),y(1) \ldots x(n),y(n)) = scale*\log(Sum(e^{**}(y(i)/scale)))$ $SW(x(1),y(1) \ldots x(n),y(n)) = -scale*\log(Sum(e^{**}(-(x(i)+y(i))/scale)))$ $NE(x(1),y(1) \ldots x(n),y(n)) = -scale*\log(Sum(e^{**}((x(i)+y(i))/scale)))$ $NW(x(1),y(1) \ldots x(n),y(n)) = scale*\log(Sum(e^{**}(-(x(i)-y(i))/scale)))$ $SE(x(1),y(1) \ldots x(n),y(n)) = scale*\log(Sum(e^{**}((x(i)-y(i))/scale)))$.

18. The system of claim 16, in which the interconnect line length is estimated as ½ the length of the boundaries of the bounding box.

19. The system of claim 16 further comprising:
(a) logic for modifying the position of at least one circuit elements of the net;
(b) logic for constructing a second bounding box that encompasses the circuit elements of the net; and
(c) logic for obtaining a second estimate of the interconnect line length needed to connect the circuit elements of the net.

20. The system of claim 16, wherein the at least one diagonal routing direction forms a 45, 60, or 120 degree angle with respect to a side of the IC layout.

* * * * *